United States Patent
Hagman et al.

(10) Patent No.: US 12,224,718 B2
(45) Date of Patent: Feb. 11, 2025

(54) TRANSIMPEDANCE AMPLIFIERS

(71) Applicant: Semtech Corporation, Camarillo, CA (US)

(72) Inventors: Matthew George Hagman, Gatineau (CA); Behzad Farzaneh, London (GB)

(73) Assignee: Semtech Corporation, Camarillo, CA (US)

( * ) Notice: Subject to any disclaimer, the term of this patent is extended or adjusted under 35 U.S.C. 154(b) by 55 days.

(21) Appl. No.: 17/591,208

(22) Filed: Feb. 2, 2022

(65) Prior Publication Data

US 2023/0246603 A1    Aug. 3, 2023

(51) Int. Cl.
*H03F 3/08*     (2006.01)
*H03G 3/30*     (2006.01)

(52) U.S. Cl.
CPC ........... *H03F 3/087* (2013.01); *H03G 3/3084* (2013.01)

(58) Field of Classification Search
CPC ............ H03F 3/087; H03F 3/08; H03F 3/082; H03G 3/3084; H03G 1/0047
USPC ................. 330/59, 308; 250/214 A, 214 AG
See application file for complete search history.

(56) References Cited

U.S. PATENT DOCUMENTS

| | | | |
|---|---|---|---|
| 6,504,429 B2* | 1/2003 | Kobayashi | H03G 3/3036 330/85 |
| 6,778,021 B2* | 8/2004 | Denoyer | H03F 3/45941 330/110 |
| 9,496,826 B2 | 11/2016 | Sugimoto | |
| 9,577,753 B2 | 2/2017 | Sugimoto | |
| 9,654,070 B2* | 5/2017 | MacDonald | H03F 3/45179 |
| 10,608,599 B2* | 3/2020 | Sugimoto | H03F 3/45183 |
| 11,394,349 B2* | 7/2022 | Sugimoto | H03G 3/3084 |
| 11,411,542 B2* | 8/2022 | Tanaka | H03F 3/45179 |
| 2007/0115068 A1 | 5/2007 | Chow | |
| 2016/0134250 A1 | 5/2016 | Imai et al. | |
| 2016/0142026 A1 | 5/2016 | Kim | |
| 2017/0163352 A1 | 6/2017 | Sugimoto et al. | |
| 2021/0167863 A1 | 6/2021 | Sugimoto et al. | |

FOREIGN PATENT DOCUMENTS

EP    2992628 B1    10/2018

OTHER PUBLICATIONS

Extended European Search Report for EP Patent Application No. 23154565.8 dated Dec. 4, 2023 (13 pages).

(Continued)

*Primary Examiner* — Khanh V Nguyen
(74) *Attorney, Agent, or Firm* — Alston & Bird LLP

(57) ABSTRACT

This application relates to transimpedance amplifier (TIA) apparatus, in particular to a TIA apparatus suitable for receiving data using burst mode communication. The apparatus has a transimpedance amplifier configured to generate a first voltage based on a current at an input node for an input signal. A controlled voltage source, such as a dummy TIA, generates a second voltage based on a first control current. A controller is configured to collectively control the first control current and a second control current based on an indication of input signal magnitude. The first control current controls the second voltage which may be used as a slicing level. The second control current is subtracted from the current at the input node and can provide a DC restore current.

20 Claims, 3 Drawing Sheets

(56) References Cited

OTHER PUBLICATIONS

Qiu et al, "*Fast Synchronization 3R Burst-Mode Receivers for Passive Optical Networks*," Journal of Lightwave Technology, vol. 32, No. 4, Feb. 15, 2014, pp. 644-659.
Final Office Action issued for Taiwan Patent Application No. 11320465630 dated May 8, 2024 w/English translation (10 pages).
1st Office Action with Search Report issued for Taiwan Patent Application No. 11320465630 dated Aug. 31, 2023 w/English translation (10 pages).

\* cited by examiner

TRANSIMPEDANCE AMPLIFIERS

TECHNICAL FIELD

This disclosure relates to methods and apparatus pertaining to or concerning transimpedance amplifiers, and methods of operation thereof, and in particular to transimpedance amplifiers for use in optical receivers operable in burst mode.

BACKGROUND

Optical data communication is used in a variety of applications. In optical communications, the data is transmitted, typically via suitable waveguides such as optical fibers, in the form of modulated light as a stream of symbols encoding the data. In some implementations, the light may be modulated between two intensity levels, i.e. high and low intensity levels (such as on and off), where one intensity level corresponds to a digital one and the other level corresponds to a digital zero. An optical receiver is then arranged to receive the transmitted light and convert the received signal to an electrical digital output, e.g. with high and low voltage levels corresponding to digital ones and zeros.

Typically, the optical receiver comprises a photodiode, which converts the received light to a photocurrent, and a transimpedance amplifier (TIA), which converts the photocurrent into a voltage. The optical receiver also includes decision circuitry for, within each symbol period, determining the relevant level of the received signal, e.g. high or low, generally by comparison with a threshold, typically referred to a decision of slice level.

Some fiber optical communication systems are continuous mode systems, in which an optical transmitter transmits the data stream over an established optical pathway, e.g. via a fiber optic cable or fiber optic network, to one optical receiver. As the launch power of the optical transmitter for the defined signal levels, and the attenuation loss of the optical pathway, do not vary much in use, the respective high and low intensity levels of the modulated light as received at the optical receiver do not vary much in use. In such a case, the gain of the TIA may be configured to provide a suitable output voltage above the noise floor of the TIA without saturation and the average level of the received light can be used to determine a suitable decision or slice level.

In some cases, however, the optical communication system may be implemented to be operable in a burst mode. In burst mode communication systems, different transmitters may transmit data to a given receiver via the same optical fiber or network in a time-division manner. In this case, as the optical paths to the different transmitters may be of different lengths and have different attenuation losses and/or the launch properties for the different transmitters may vary, the received high and low intensity levels may vary for the different transmitters. In this case, the time averaging method of determining a suitable decision or slice level may not generally be suitable, as the time required to settle is generally longer than the data payload of each burst. Also, as the amplitude of received optical signal, e.g. the received high intensity level, can vary relatively significantly from burst to burst from the different transmitters, a gain setting for the TIA which avoids saturation for received high amplitude signals may not provide a good signal-to-noise ratio (SNR) for received low amplitude signals.

Conventionally, burst mode optical communication systems may therefore be implemented with an optical receiver having a TIA that is operable in a plurality of discrete gain modes. For instance, there may be one mode of operation, with a particular gain setting, for received low amplitude signals and separate modes, with different gain settings, for received signals of higher amplitude. The optical receiver may determine an appropriate mode of operation for a given burst.

Whilst switching between such different gain modes can provide an appropriate gain setting for each burst, there is an overhead with respect to the amount of time required to detect how strong a signal is and then switch to the required gain state, and to allow time for settling in the selected gain state before the relevant decision level can be determined. In addition, such operation generally involves a guard time listening requirement, where the optical receiver enters a listening mode between data bursts, known as a guard time period, so that small signals may be detected above the noise floor of the TIA. These requirements may limit the minimum acceptable time between different data bursts, and hence the maximum achievable data throughput.

In addition, there is the risk that any significant fluctuations in the received intensity levels during a burst for any reason could result in a change in gain state. Changing gain state during a burst is generally problematic, especially if it occurs during the data payload. Similarly, a shift in the average number of ones and zeros during a given interval could potentially be interpreted as a change in signal magnitude and result in a change in gain state. For instance, if, for some reason, there were significantly more ones than zeros in a given interval, this could be interpreted as an increase in signal magnitude and result in a change in gain state.

SUMMARY

Embodiments of the present disclosure relate to transimpedance amplifiers and operation thereof that at least mitigate at least some of these issues.

According to some embodiments there is provided a transimpedance amplifier apparatus comprising:
- a transimpedance amplifier configured to generate a first voltage based on a current at an input node for an input signal;
- a controlled voltage source for generating a second voltage based on a first control current; and
- a controller for collectively controlling the first control current and a second control current based on an indication of input signal magnitude, wherein the second control current is subtracted from the current at the input node.

In some examples, the controller may be configured such that: for a first range of input signal magnitude, the magnitude of the first control current depends on the input signal magnitude and increases with increasing input signal magnitude whilst the magnitude of the second control current is substantially constant: and for a second, higher, range of input signal magnitude, the magnitudes of both the first and second control currents depend on the input signal magnitude and the magnitude of the second control current increases with increasing input signal magnitude while the magnitude of the first control current reduces. The magnitude of the first control current may reduce with increasing signal amplitude until it reaches its initial value, or some other value suitable for the voltage limitations of the transistors used in the design. In some examples, the controller may control the sum of the magnitudes of the first and second control currents to be equal to a master control current that varies proportionally with the input signal magnitude.

In some examples, the controller may comprise a current steering circuit comprising a differential pair of transistors for steering current to a first circuit branch for the first control current or a second circuit branch for the second control current, wherein the current steering circuit is configured to steer current to the second circuit branch for input signal magnitudes above a threshold, and wherein the total current through the first and second current branches is controlled based on the input signal magnitude. The controller may further comprise a current mirror for mirroring the master control current and outputting the mirrored current as an indication of received signal strength.

In some examples, the controller may be further configured to controllably vary a gain of the transimpedance amplifier with input signal magnitude for at least one range of input signal magnitude such that gain varies substantially continuously with input signal magnitude. The controlled voltage source may comprise a dummy transimpedance amplifier. The controller may be configured to control a gain of the dummy transimpedance amplifier in accordance with the gain of the transimpedance amplifier. The controller may be configured to controllably vary the gain of the transimpedance amplifier by controllably varying a feedback resistance of a feedback resistance network connected across the transimpedance amplifier. In some examples, the feedback resistance network may comprise at least a first transistor in parallel with a first resistor and the controller may be configured to control the resistance of the first transistor so as to control the feedback resistance. The feedback resistance network may, in some implementations, comprise a second resistance in series with the first resistance and a second transistor connected in parallel with the series connection of the first and second resistances, and the controller may be further configured to control the resistance of the second transistor so as to control the feedback resistance.

In some examples, transimpedance amplifier circuit may be operable in at least first mode for supporting a first data rate and a second mode for supporting a second, different, data rate. The controller may be configured to controllably vary the resistance of the first transistor with input signal magnitude in the first mode of operation and to controllably vary the resistance of the second transistor for higher input signal magnitudes in both the first and second modes of operation. In some embodiments, the transimpedance amplifier may comprise a compensation network configured to controllably vary an open-loop gain of the transimpedance amplifier to compensate for any changes in feedback resistance. The compensation network may comprise at least one compensation circuit branch between a compensation node of the transimpedance amplifier and a reference voltage. The compensation circuit branch may comprise a transistor for controlling the connection of a series capacitance and resistance of the compensation circuit branch to the compensation node.

In some example, the transimpedance amplifier circuit may comprise an integrator configured to receive a first integrator input based on the first voltage and a second integrator input based on the second voltage and to generate a corresponding integrated value as said indication of input signal magnitude. There may be a summing node for summing the first and second voltages with DC offset signals from a DC offset controller to provide the first and second integrator inputs. In some examples, the integrator may be operable with a plurality of different time constants to support fast convergence (short time constant) when a new burst mode signal is received, and a longer time constant when the received signal is stable and data payload is present. The transimpedance amplifier circuit may further comprising a reset controller configured to change the integrator back to its fast convergence (short time constant) mode in response to a received reset trigger.

In another aspect there is an optical receiver comprising the transimpedance amplifier circuit of any of the embodiments described herein, wherein the optical receiver is operable to receive burst mode optical data.

In another aspect there is provided, a transimpedance amplifier apparatus comprising:
  an input transimpedance amplifier for generating a first voltage based on a current at an input current node;
  a dummy transimpedance amplifier for generating a second voltage based on a first control current; and
  a control loop comprising:
  an integrator for generating an integrated value based on the first and second voltages; and
  a controller configured to control the first control current, a DC restore current subtracted from the input current node and a gain of the input transimpedance amplifier based on the integrated value.

The control loop may be configured to generate a master current based on the integrated value and wherein an indication of received signal strength is output based on the master control current.

In another aspect there is provided a transimpedance amplifier apparatus comprising:
  an input transimpedance amplifier for generating a first voltage based on a current at an input current node;
  a dummy transimpedance amplifier for generating a second voltage; and
  a control loop configured to control a first control current for the dummy transimpedance amplifier, a DC restore current applied to the input current node and a gain of the input transimpedance amplifier, such that each of the first control current, DC restore current and gain vary continuously with input signal magnitude over at least part of the input dynamic range of the transimpedance amplifier apparatus.

Unless otherwise indicated to the contrary, any of the features of any of the embodiments described herein may, where compatible, be implemented together with any one or more of the other features of the embodiments.

BRIEF DESCRIPTION OF THE DRAWINGS

To better explain various embodiments and examples of the present disclosure and the principles, example implementation and operation thereof, reference will now be made, by way of example, to the following drawings, in which.

DETAILED DESCRIPTION

Embodiments of the present disclosure relate to transimpedance amplifiers and, in particular, to transimpedance amplifiers suitable for use in an optical receiver operable in burst mode. In embodiments of the present disclosure, one or more parameters of the transimpedance amplifier, such as a slicing level, DC restore current and/or gain, may vary in a relatively continuous manner with received signal magnitude for at least part of an operating range of signal magnitude.

Figure 1:
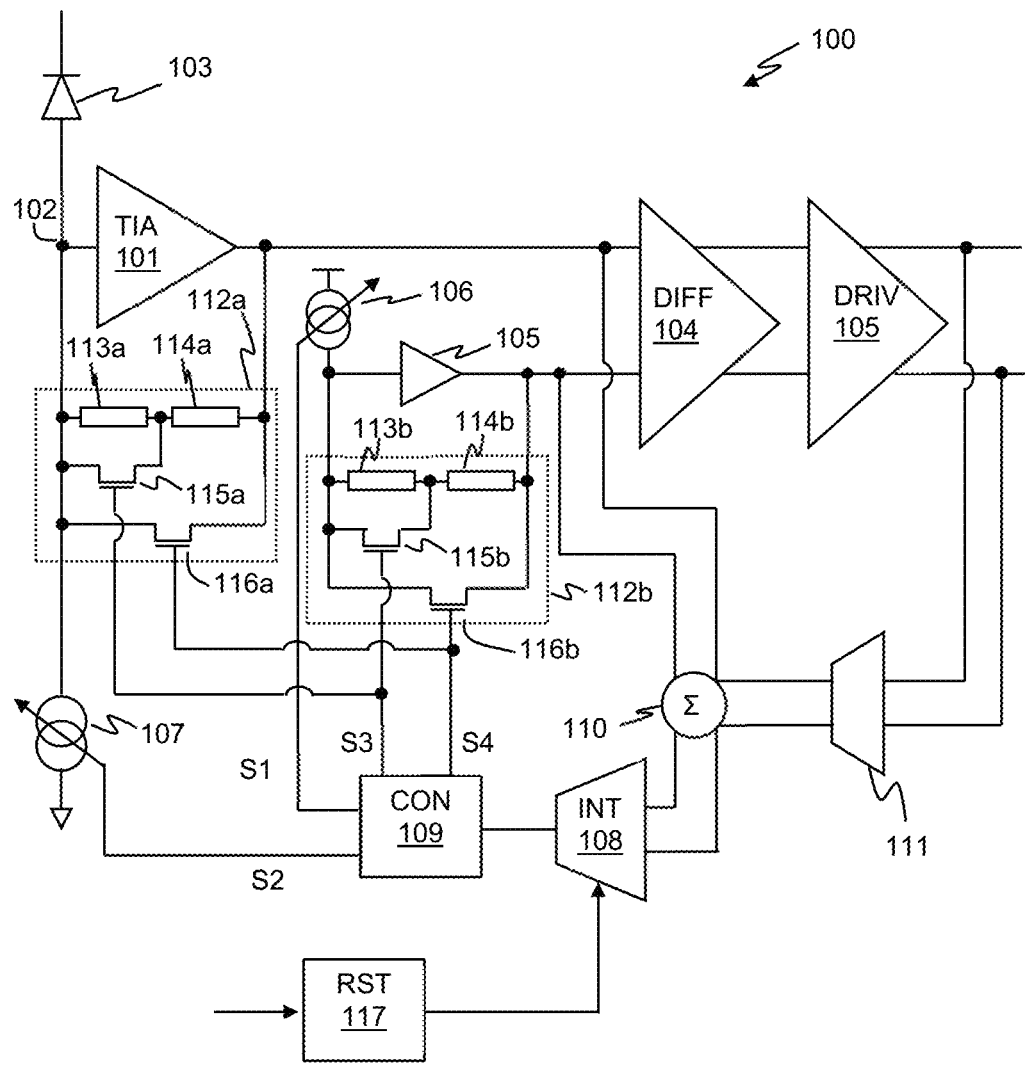
FIG. 1 illustrates one example of a transimpedance amplifier apparatus according to an embodiment.

FIG. 1 illustrates one example of a transimpedance amplifier apparatus 100 according to an embodiment. FIG. 1 illustrates that a transimpedance amplifier (TIA) input stage 101 is arranged to receive an input current at an input node 102, in this example from a photodiode 103. The TIA input stage 101 drives a first input of a differential limiting amplifier 104. The differential limiting amplifier 104, in this example, drives an output driver 105 to provide a differential voltage output.

A second input of the differential limiting amplifier 104 is driven by a controlled voltage source, which in this embodiment comprises a 'dummy' TIA stage 105 with an input configured to receive a first control current IC1, e.g. from a variable current source 106. As will be understood by one skilled in the art, a dummy TIA is an amplifier or other voltage source that uses at least some similar components to the TIA input stage 101, e.g. a replica of the input TIA stage, so that any manufacturing process variations that affect the TIA input stage also apply the dummy TIA and the dummy TIA will exhibit substantially the same variation as the input TIA stage to any variation in operating conditions such as temperature.

The input node 102 for the input TIA stage 101 is also coupled to a variable current source 107, for subtracting a second control current IC2 from the input current at the input node 102, as will be discussed below. The current sources 106 and 107 are controlled as part of a control loop comprising integrator 108 and controller 109. Note that as used herein the term variable current source shall be taken to refer to any component or circuitry for sourcing or sinking a current, where the value of the current may be controllably varied within a range of different current values, for instance in a generally continuous manner. Thus, a component which can only provide a fixed non-zero current if active and no current if inactive is not, on its own, a variable current source as the term is used herein. In other words, a variable current source must be able to selectively provide a plurality of different non-zero current values, preferably in a generally continuous manner across an operating range, although it will be understood that the variable current source may additionally be controlled, in use, to provide zero-current.

The integrator 108 of the control loop receives inputs based on the output of the TIA input stage 101 and also the output of the dummy TIA 105. In the example of FIG. 1, these inputs are summed, at summing node 110, with an offset null signal from offset null loop controller 111 to take account of any DC offset.

The controller 109 is responsive to the output of the integrator 108 to control the magnitude or strength of the control currents IC1 and IC2 generated by the current sources 106 and 107. FIG. 1 illustrates that controller 109 may generate respective control signals S1 and S2 for controlling current sources 106 and 107, but in some embodiments the controller 109 may effectively generate the control currents IC1 and IC2.

The control loop, comprising the integrator 108 and controller 109, operates so that the time-average of the differential signal input to the differential limiting amplifier 104 is zero, i.e. so that the output of the dummy TIA 105 is equal to the time average of the output of the TIA input stage 101. The output of the dummy TIA 105 can thus be seen as a slicing level for the TIA input stage 101.

For relatively low magnitude input signals, within a first range of input signal magnitude, the controller 109 controls the current source 106 so that the magnitude of the first control current IC1 increases with increasing signal magnitude, i.e. the magnitude of the first control current IC1 depends on the input signal magnitude and varies proportionally with the input signal magnitude. As will be understood by one skilled in the art, any optical signal received at the photodiode 103 will result in a photocurrent of one polarity. In general, a photocurrent generated by the photodiode will lead to a voltage drop of the TIA input stage 101. For relatively small input signal magnitudes, i.e. relatively low input photocurrents, the controller 109 controls the current source 106 to generate the control current IC1 for the dummy TIA 105 so that the voltage generated by the dummy TIA tracks the average output from the TIA input stage 101. Thus, as the magnitude of the received signal increases, i.e. there is a larger input photocurrent, the controller 109 provides a larger control current IC1 for the dummy TIA 105, so that the output voltage of the dummy TIA, e.g. the slicing level, drops accordingly.

For larger magnitude input signals, within a second range of input signal magnitude, the controller 109 may control current source 107 such that the magnitude of the second control current IC2 increases with increasing input signal magnitude, i.e. the second control current IC2 depends on the input signal magnitude and varies proportionally with input signal magnitude. The control current IC2 from the current source 107 is effectively subtracted from the input photocurrent at the input node 102 to avoid saturation of the TIA input stage 101. The control of current source 107 in this way provides DC restoration, in which a DC portion of the received photocurrent is subtracted from the input photocurrent to avoid amplifier overload at large signal magnitudes.

It is noted that DC restoration is known for burst mode TIAs, but conventional DC restoration generally operates with a fixed DC restore current that applies in a given gain state of operation. Implementing a variable DC restore current in a conventional burst mode TIA arrangement would generally require an additional control loop, coupled to the main control loop, and having two coupled control loops can present significant challenges in terms of ensuring system stability without undue settling times. For instance, in a conventional burst mode TIA, the slicing level may be determined by a feedforward low pass filter arrangement and providing an additional nested control loop to control DC restore current could significantly extend settling time and/or compromise system stability. Thus, for a conventional burst mode TIA, the DC restore current is generally predetermined and fixed for a given gain mode to avoid the need for an additional control loop. In embodiments of the present disclosure, within the second input range, the value of the DC restore current IC2 is controllably varied with received signal magnitude so as to provide a varying level of DC restoration. As will be discussed in more detail below, embodiments of the present disclosure control both the slicing level and DC restore current simultaneously using a single control loop.

The control currents IC1 and IC2 are controlled together in a coordinated and sequenced fashion. That is, for received signal magnitudes in the first input range, the control current IC1 for the dummy TIA 105 may be controlled to vary with signal magnitude whilst the second controlled current is held at a substantially constant, e.g. at a minimum value, which may be zero, as it is generally desirable not to subtract any significant amount of the input photocurrent for relatively small signal magnitudes, as this could negatively impact on noise performance. For received signals in the second input range, the second control current IC2 may be increased with increasing signal magnitude, so as to subtract photocurrent from the input and prevent saturation. In this case, a related or corresponding reduction in the control current IC1 may be applied to take account of the reduced input photocurrent. Thus, for input signal magnitudes in the second range, both the first and second control currents IC1 and IC2 may depend on the input signal magnitude, but the second control current may vary proportionally with input signal magnitude whilst the first control current varies inversely proportionally with input signal magnitude or it is reduced by any other means to arrive at some suitable final value.

Figure 2:
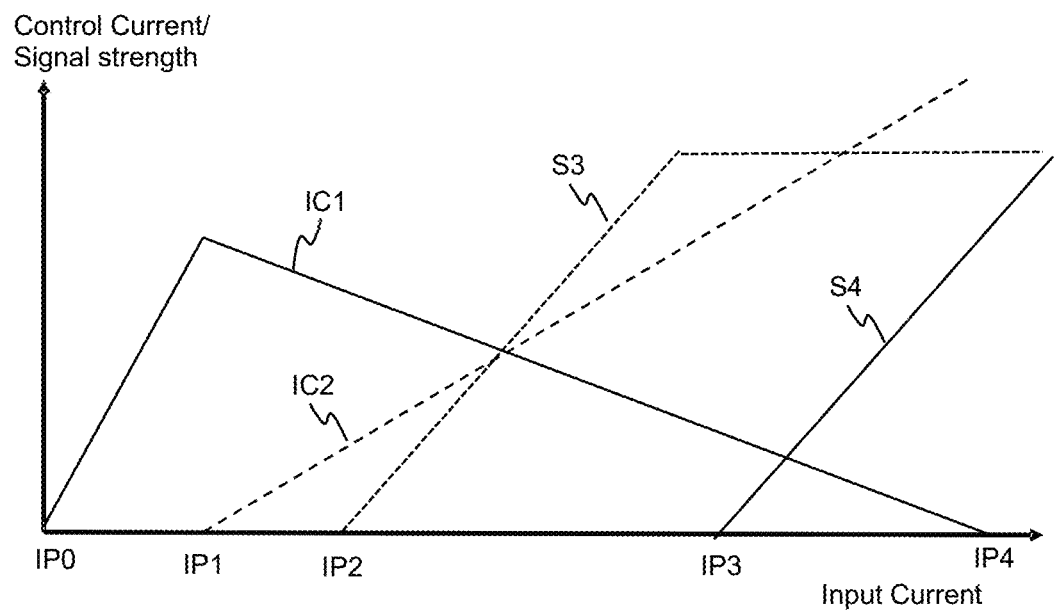
FIG. 2 illustrates an example of sequencing of control signals for the embodiment of FIG. 1.

FIG. 2 illustrates one example of the principles of suitable sequencing. FIG. 2 illustrates how the magnitude of control currents IC1 and IC2 may vary with levels of input current at the input node 102, i.e. the received photocurrent. FIG. 2 illustrates that for a first input range, in this case between a minimum input photocurrent value IP0 and a first value of input photocurrent IP1, the value of the control current IC1 for the dummy TIA may be increased, e.g. from zero or some other minimum value, with increasing magnitude of photocurrent, whilst the value of the DC restore control current IC2 is maintained at a low level, which may be zero. For a second range of input current magnitude, e.g. above IP1, the value of the DC restore control current IC2 may be increased with increasing input current magnitude, and the value of the control current IC1 for the dummy TIA 105 may be reduced in a related way. The extent of the first input range will depend on the particular application and circuit design, but in some embodiments, the first input range may extend from a minimum input current value IP0 of zero to a value IP1 of say a few tenths of milliamps.

Advantageously the control currents IC1 and IC2 may be sequenced linearly with respect to signal magnitude, i.e. so that, as illustrated in FIG. 2, control current IC1 increases substantially linearly with signal magnitude in the first input range and control current IC2 increases substantially linearly with signal magnitude (with a related linear decrease of in control current IC1). The control currents IC1 and IC2 may collectively be seen as being parts of an overall master control current, i.e. the master control current is the sum of the control currents IC1 and IC2. The controller 109 determines an appropriate master control current based on the output of the integrator 108 and divides the master control current between the control current IC1 for the dummy TIA and the control current IC2 for DC restoration in a sequenced manner with respect to the input signal magnitude.

There are a variety of ways in which the controller 109 may generate the control currents IC1 and IC2, as will be understood by one skilled in the art. Conveniently, however, the controller 109 may comprise a current steering circuit, such as illustrated in FIG. 3.

Figure 3:
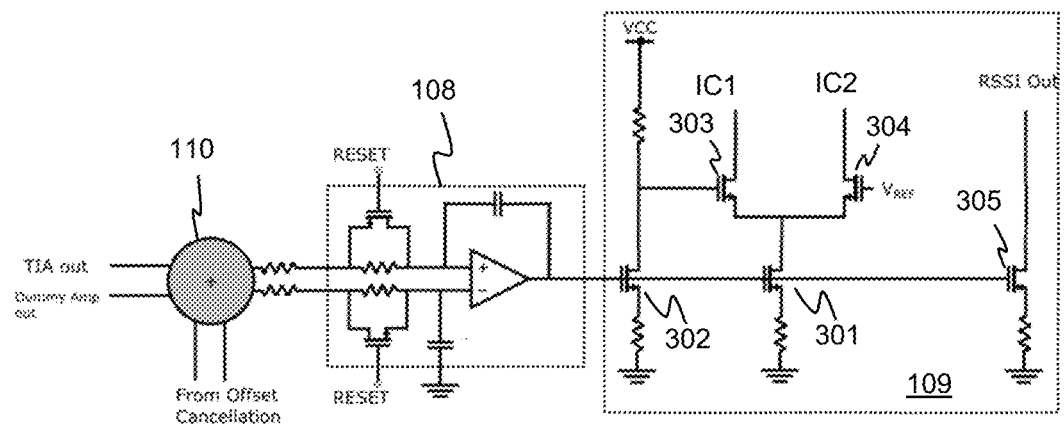
FIG. 3 illustrates; one example of a suitable current steering arrangement for the controller.

FIG. 3 illustrates that the integrator 108 receives its input from the summing node 110 and provides an integrator output to the controller 109 to drive the gate of a first transistor 301, which is in common with first and second circuit branches for providing the control currents IC1 and IC2 respectively. The output of the integrator controls the amount of current through the first transistor 301 and hence the sum of the control currents IC1 and IC2, i.e. the master control current. To provide steering of the control currents, the output of the integrator also drives the gate of a second transistor 302 located in an additional circuit branch comprising series resistances. The current through the second transistor 302 and thus through additional circuit branch is thus related to the master control current, and this current generates a gate voltage for transistor 303 in the circuit branch for the IC1 control current, whilst the gate of transistor 304 in the circuit branch for the IC2 control current is maintained at a define reference voltage. Transistors 303 and 304, which may for example be NFET devices, thus act as a differential pair for controlling the respect control currents IC1 and IC2.

As the output of the integrator 108 increases, the current through the first transistor 301 will increase, which will initially flow via the first circuit branch for the control current IC1 only, until a threshold is reached at which point the transistor 304 starts conducting. The relevant threshold can be determined, as will be understood by one skilled in the art, by choice of the reference voltage Vref and/or by choice of resistances for the additional circuit branch. Any further increase in current will increasingly be steered to the second circuit branch for the control current IC2, with the current IC1 through the first circuit branch decreasing. This arrangement thus provides the property of a master control current that scales proportionally with the output of the integrator 108 and hence with input signal magnitude and ensures that the two control currents IC1 and IC2 sum to the desired master control current, with appropriate steering of these control currents. It will be understood that, advantageously, the two control currents IC1 and IC2 are controlled simultaneously by the same control loop.

In some embodiments, the controller 109 may also be configured to provide an output indicative of the received signal strength. As discussed above, the current through the first transistor 301 provides the master control current, which is related to the received signal strength. This master control current through the first transistor can be mirrored by a suitable current mirror, e.g. via transistor 305, to provide a related current as an indication, RSSI Out (received signal strength indication), without any significant additional complexity, circuit area or power requirements. There are a number of reasons why it may be advantageous to provide an indication of received signal strength, but conventionally such an indication would be generated separately by dedicated measuring circuitry. In embodiments of the present disclosure, the control loop may effectively provide such an indication as part of the normal operation.

The embodiments described above thus control a first control current IC1 for determining a slicing level for the TIA apparatus together with a second control current IC2 for DC restoration at an input node. Additionally or alternatively, in some embodiments, a gain of the TIA apparatus may be controllably varied in a relatively continuous manner with signal magnitude for a range of input signal magnitudes. In some embodiments, a gain of the TIA input stage may be varied by varying a feedback resistance for the TIA input stage.

Referring back FIG. 1, each of the TIA input stage 101 and dummy TIA stage 105 has a respective variable resistance feedback network 112a and 112b, the resistance of which is also controlled by controller 109. In this example, the feedback network 112a comprises first and second resistance 113a and 114a in series, with first transistor 115a in parallel with the first resistance 113a and second transistor 116a in parallel with the series connection of the first and second resistances. In this example, the feedback network 112b similarly comprises first and second resistances 113b and 114b and first and second transistors 115b and 116b in a similar arrangement. The resistance values of the first and second resistances 113b and 114b of the feedback network 112b may have a desired scaling with respect to the first and second resistances 113a and 114a of the feedback network 112a.

The first transistor 115a of the feedback network 112a thus provides a path for bypassing the first resistance 113a. Such an arrangement can be beneficial for providing a TIA apparatus which is operable at different data rates.

As will be understood by one skilled in the art, optical communication systems may be implemented to transfer data at different data rates. For instance, data rates of 10 Gbs/s and 25 Gb/s are two data rates that may be used in some implementations. Advantageously, the TIA apparatus of embodiments of the disclosure is configured to be operable at multiple data rates, for instance in a first mode for a first data rate, say 10 Gb/s, and in a second mode for a second data rate, say 25 Gb/s. The integrator 108 may thus be operable with at least two different time constants appropriate for the relevant data rates as would be understood by one skilled in the art. The appropriate data rate mode may be determined from the received signal by a component such as a MAC device (not illustrated) as would be understood by one skilled in the art. The data rate, once determined, can be used to set the operating data rate mode.

The provision of the first resistance in series with the second resistance as part of the feedback network for the TIA input stage 101, where the first resistance can be selectively bypassed, can allow the feedback resistance to be tuned for a particular data rate so as to improve noise and bandwidth.

Thus, for example, where the TIA apparatus 100 is operable in a 10 Gb/s mode and a 25 Gb/s mode, a greater resistance for the feedback path can improve the noise and bandwidth for operation in the 10 Gb/s mode. Providing the first and second resistances 113a and 114a in series, where the first resistance 113a can be selectively bypassed, allows the first resistance 113a to contribute to the overall feedback resistance when operating in the 10 Gb/s mode, but bypassed when operating in the 25 Gb/s mode. Thus, the series combination of the first and second resistance 113a and 114a may be selected to provide an appropriate feedback resistance for the 10 Gb/s mode, but for the 25 Gb/s mode, first transistor 115a may be turned fully on, so as to bypass the first resistance 113a, with the second resistance being selected as desired resistance for the 25 Gb/s mode.

In a conventional variable resistance feedback network, the first transistor may generally be controlled to be fully on or fully off. However, by controlling the first transistor 115a appropriately, the effective contribution of the first resistance 113a to the feedback around the TIA input stage 101 can be continuously varied, i.e. the first transistor 115a acts as a variable resistance. In other words the resistance of the feedback path can be controllably reduced or increased in a relatively continuous fashion, which can be advantageously be used to provide a relatively continuous variation of gain for the TIA inputs stage 101.

For example, in the example where the TIA apparatus 100 is operable in a 10 Gb/s mode and a 25 Gb/s mode, the extra first resistance 113a of the feedback path can, as noted, improve the noise and bandwidth for operation in the 10 Gb/s mode, but, in embodiments of the present disclosure, the overall feedback resistance may be gradually reduced as the input signal magnitude increases to provide a variable gain control when operating in the 10 Gb/s mode.

Thus, when operating in at least the first data mode, for input signals above a certain magnitude, e.g. IP2, the first transistor 115a of the feedback network may be controlled so as to progressively become more conductive so as to reduce the contribution of the first resistance 113a to the overall feedback resistance. The first transistor 113b of the variable feedback network 112b for the dummy TIA 105 may also be controlled in the same way so as to maintain the desired scaling between the relevant feedback resistances. The controller 109 may thus generate a control signal, illustrates as S3, to control the transistors 115a and 115b accordingly. FIG. 2 illustrates that the control signal S3 may be controlled, in the first data rate mode, so as to vary with received signal magnitude above an input current threshold IP2 so as to progressively reduce the effective contribution of the resistances 113a and 113b to the respective feedback paths in a relatively continuous manner.

In the second data rate mode, the first transistor 115a may be controlled so as to be fully on at all signal magnitudes. In this case, the gate voltage of transistor 115a could be switched (not illustrated) so as to receive a fixed defined gate voltage that maintains the first transistor fully on, and the first transistor 113b of the variable feedback network 112b for the dummy TIA 105 may also be controlled in the same way.

In addition, for even higher signal magnitudes, e.g. above a threshold IP3, the controller 109 may control the second transistors 116a and 116b of the feedback networks 112a and 112b, via control signal S4, so as to reduce the overall feedback resistance, so as to reduce gain for relatively high magnitude input signals. Such operation may be beneficial for operation in both the first and second data rate modes.

Note that conventional TIA amplifiers operable for burst mode communication, transistors may be used to short out feedback resistors in certain discrete gain modes, which generally requires relatively large transistors to provide a low on-resistance. In the example of FIG. 1, the first transistor 115a is effectively controlled as a variable resistance in parallel with the resistance 113a and thus the transistor 115a can be implemented as a relatively small device.

It should also be understood that FIG. 1 illustrates an example of a variable resistance feedback network with two resistances in series, with first and second transistors for varying the overall feedback resistance, but other implementations could use different numbers of resistance and/or transistors, and/or could provide a variable feedback resistance in other ways.

It should also be understood that FIG. 2 illustrates that the controls signals S3 and S4 increase with increasing signal level so as to turn on increasingly the relevant transistors, but the appropriate control signals will depend on the particular implementation. It will also be understood that FIG. 2 illustrates the principle of general sequencing of the control signals with input signal magnitude, and is not intended to represent accurate magnitudes of the respective signals and it will also be understood that the gate control signals S3 and S4 are generated as gate control voltages, whereas IC1 and IC2 are control currents.

Figure 4:
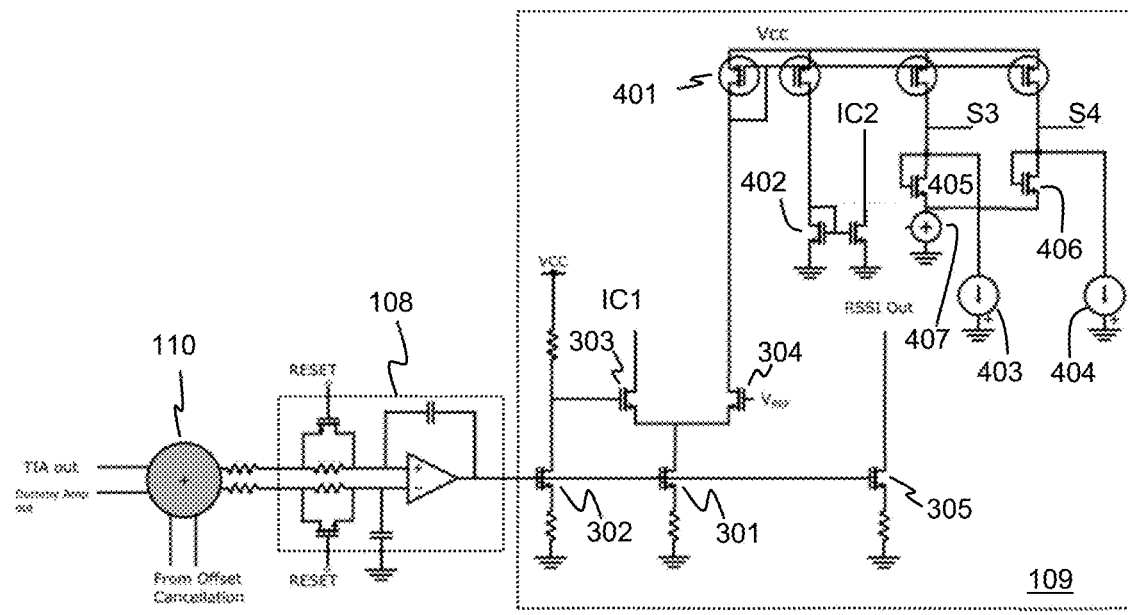
FIG. 4 illustrates another example of a suitable controller.

The gate control voltages S3 and S4 may, in some cases, by generated from suitable control currents generated by the controller 109. FIG. 4 illustrates an example of at least part of a controller 109 in which similar components as discussed with reference to FIG. 3 are identified by the same references.

In the example of FIG. 4, the output of the integrator defines a master current through transistor 301 and this master current is steered into a first and second branches by transistors 303 and 304, so as to define the control currents IC1 and IC2, in generally the same manner as discussed with reference to FIG. 3. In this example, however, the current in the second circuit branch, which defines the control current IC2, is also used to control the generation of the control signals S3 and S4. A current mirror arrangement 401 generates currents equal to IC2 in three additional circuit branches. A further current mirror 402 in one of the additional branches generates the output control current IC2.

In each of the other two additional circuit branches, respective current sources 403 and 404 subtract a respective defined current which is set so as to define the respective thresholds IP3 and IP4. Any current above the respective threshold flows through a respective diode connected transistor 405 or 506, which thus results in a corresponding output voltage as the respective gate control voltage S3 or S4. The diode connected transistors may be connected to a voltage source which provides an appropriate voltage offset so that the gat control voltages S3 and S4 are suitable for the transistors of the variable feedback network.

In this way, the gate control voltage S3 remains static as long as the control current IC2 is lower than the threshold IP2 defined by current source 403, but then increases with the control current IC2 above this threshold. Likewise, the gate control voltage S4 remains static as long as the control current IC2 is lower than the threshold IP3 defined by current source 404, but then increases with the control current IC2 above this threshold. Once the control current IC2 exceeds current source 403 (or 404), the gate voltage defined by transistor 405 (or 406) will be applied to transistors 115a and 115b (or 116a and 116b) and the resulting change in conductance in these transistors will vary linearly with control current IC2.

The gain for the TIA input stage 101 can thus be automatically controlled to vary with input signal magnitude, and, for at least one range of input signal magnitudes, may vary in a relatively continuous manner. However, varying the feedback resistance will generally also vary the bandwidth for the TIA input stage 101.

Trans-impedance amplifiers have an intrinsic gain-bandwidth product and if the feedback resistance for the TIA input stage 101 is reduced, as discussed above, the bandwidth of the TIA input stage 101 would increase with increased response peaking and noise. In general, when the feedback resistance is reduced, the input impedance of the trans-impedance amplifier will decrease since the input impedance is the feedback resistor divided by the open loop gain of the amplifier. If the input impedance of the TIA input stage 101 is reduced, capacitance associated with the input node 102, such as the capacitance of the photodiode 103, can result in an undesirable increase in bandwidth. For example, the capacitance of the photodiode could resonate more with the inductance of an input bondwire and will cause an increase in bandwidth and possibly frequency response peaking.

In some embodiments the TIA input stage 101 may comprise a compensation network configured to compensate for the reduction in feedback resistances to prevent an excessive change in bandwidth. The compensation network may be controlled in coordination with any change in the feedback resistance so as to controllably vary the open loop gain for the TIA input stage 101.

Figure 5:
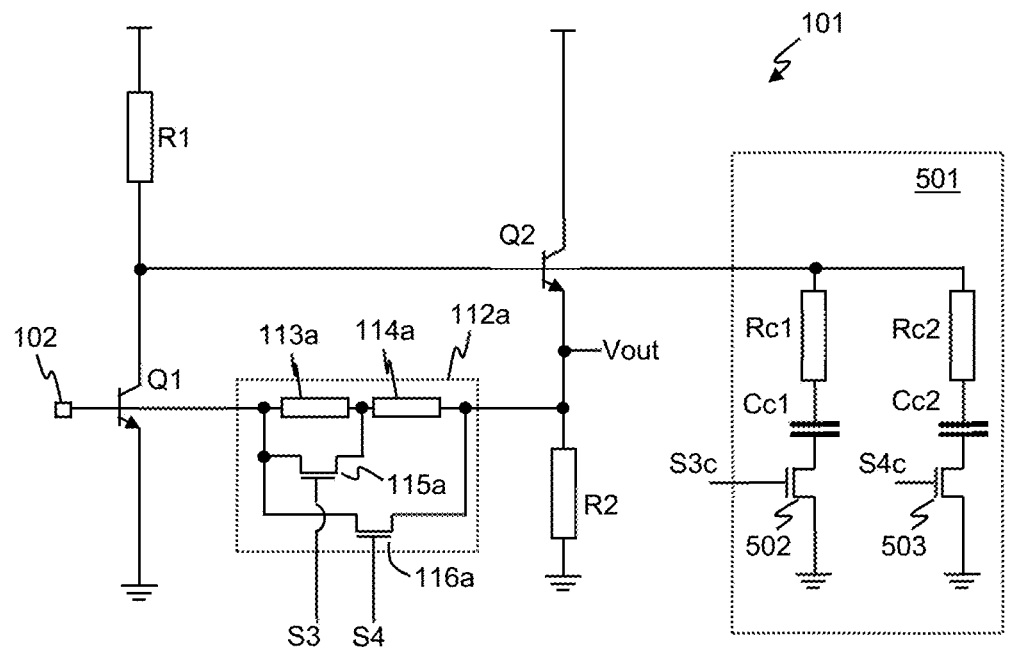
FIG. 5 illustrates one example of a TIA with open loop gain compensation.

FIG. 5 illustrates one example of a TIA input stage 101 having a compensation network 501. In the example of FIG. 5, the TIA input stage 101 is illustrated as a simple amplifier comprising bipolar transistors Q1 and Q2, but it will be understood by one skilled in the art that other designs of transimpedance amplifier could be implemented, which could use additional or alternative components. FIG. 5 also illustrates the variable feedback network 112a as discussed above with reference to FIG. 1.

The TIA input stage 101 of FIG. 5 also comprises a compensation network, which in this case comprises a first compensation branch comprising compensation resistance Rc1 and compensation capacitance Cc1 in series with transistor 502 and a second compensation branch comprising compensation resistance Rc2 and compensation capacitance Cc2 in series with transistor 503. Each compensation circuit branch is connected between a compensation node of the TIA amplifier, i.e. a node to which the compensation is applied to vary the open loop gain, and a defined reference voltage, which is ground in this example. Transistor 502 of the first compensation branch is controlled by a control signal S3c, which varies together with the control signal S3 for controlling the first transistor 115a of the feedback network 112a, although in some cases there may be a defined voltage offset between the control signals S3 and S3c to account for transistors 115a and 502 being at different potentials. Likewise, transistor 503 of the second compensation branch is controlled by a control signal S4c, which varies together with, but may be offset from, the control signal S4 for controlling the second transistor 116a of the feedback network 112a.

In use, as the control signal S3 is varied so as to reduce the overall feedback resistance of the feedback network 112a, the transistor 402 of the first compensation branch is controlled in a corresponding manner to vary the connection of the compensation resistance Rc1 and capacitance Cc1 to the compensation node of the TIA input stage so as to reduce the open loop gain for high frequencies and thus constrain the bandwidth. Transistor 403 is similarly controlled together with the second transistor 116a of the feedback network so as to control the connection of the second compensation branch to compensate for the variation in feedback resistance, and limit or prevent any significant unwanted change in bandwidth.

Embodiments of the present disclosure thus relate to a TIA apparatus that operates to controllably vary the parameters of the TIA, such as slicing level, DC restore current and/or gain, with input signal magnitude. Various different parameters may be collectively controlled, and may controllably vary in a generally continuous manner over different ranges of input signal magnitude in a coordinated fashion, i.e. with defined sequencing with input signal magnitude. For instance, referring back to FIG. 2, for small signal magnitudes, below a threshold IP1, the control current IC1 may be controlled to a value based on the input signal magnitude to control the voltage level generated by the dummy TIA 105, which can be seen as the slicing level. For input signal magnitudes below the threshold IP1, there may be a minimum DC restore current IC2, which may be zero, and the resistance of each of the feedback networks 112a and 112b may have a fixed value relevant for the relevant data rate mode.

For higher input signal magnitudes, above IP1, the control current IC2 may be increased with increasing signal magnitude to provide an increasing DC restore current and prevent amplifier saturation. For higher magnitudes, above IP2, control signal S3 may vary with signal magnitude so as to continuously vary the feedback resistance of the feedback networks 112a and 112b and reduce the TIA gain in a first data rate mode, e.g. a 10 Gb/s mode, and for even higher signal magnitudes the control signal S4 may be varied with signal magnitude to further reduce the feedback resistance and reduce gain so as to prevent overload. The relevant thresholds for the input current may be configured for a particular application but purely by way of example, in one implementation the threshold IP1 could be of the order of 0.1 to 0.3 mA, the threshold IP2 could be of the order of 0.4 to 0.6 mA and the threshold IP3 could be of the order of 1.25 to 1.75 mA.

All of these parameters may be continuously varied with input signal magnitude in a sequenced fashion as described by a single control loop comprising the integrator 108 and controller 109. As noted above the integrator 108 may be operable with a plurality of different time constants so as to support fast settling when a reset signal is received (due to a new burst of data), and one or more slower settling modes to support different data rates.

Embodiments of the present disclosure thus avoid any sudden jumps in gain state as the gain of the TIA apparatus varies in relatively continuous manner with input signal magnitude. The TIA apparatus may even adapt to changes in signal power during the data payload without causing bit errors and the TIA apparatus can gradually adapt the DC restore level and/or gain.

As the adaption of the slicing level (i.e. the voltage output of the dummy TIA), the DC restore current and the gain settings occurs constantly, there is no requirement for any kind of initialisation mode. Conveniently, to allow the TIA apparatus to adapt appropriately for each burst, the integrator 108 may be reset for each burst so as to clear the stored integrator value indicative of received signal level. Thus, as illustrated in FIG. 1, a reset controller 117 may generate a reset signal for resetting the integrator 108 in response to a new burst. As will be understood by one skilled in the art, the reset signal may be generated in response to reset trigger which be transmitted as an initial part of a data burst and which could be determined, e.g. by a suitable MAC device.

Following a reset, the settling of the slicing level, any DC restore current and gain setting occurs simultaneously, which avoids the need for any settling to be re-started following a change in gain state, as is required for convention TIAs with discrete gain states.

As the various control signals are ganged together and sequenced by a simple controller, the entire dynamic range of the TIA apparatus can be controlled via the same control loop, i.e. with only one integrator. This is advantageous in terms of speed of settling. In at least some implementations the settling time could be of the order of 20 ns or less, or 15 ns or less. This can allow for more time to be allocated to the data payload and provide higher data throughput. This also avoids jumps in gain setting as may occur with a discrete gain state TIA amplifier. Thus the control loop may be configured to control a first control current for the dummy TIA, a DC restore current applied to the input current node and a gain of the input TIA stage, such that each of the first control current, DC restore current and gain vary continuously with input signal magnitude over at least part of the input dynamic range of the transimpedance amplifier apparatus.

In addition, embodiments allow a TIA operable in burst mode to have a continuously variable DC restore current, allowing the TIA apparatus to receive large signals with an appropriate, more precise level of current than for conventional burst mode TIAs with fixed DC restore currents.

Embodiments provide a TIA apparatus in which a first control loop generates a master control current proportional to input signal magnitude and controls at least one of a slicing level, DC restore current and gain of an input TIA stage based on the master control current. The master control current may be used as an indication of received signal strength.

Embodiments of TIA apparatus according to the present disclosure can advantageously be used as part of optical receivers operable to receive burst mode communications. However, whilst primarily described in terms of use in optical receivers, the TIA apparatus of embodiments of the disclosure may advantageously be used in other applications, in particular where an input current magnitude may vary in a similar fashion.

It will be understood that the examples and embodiments described above are given by way of example only and those skilled in the art will understand that modifications, variations, additions or alterations may be made to specific embodiments described, or alternative embodiments may be implemented, without departing from the scope of the appended claims.

It should be noted that as used herein, unless expressly stated otherwise, the word "comprising" does not exclude the presence of other elements or steps other than those listed, references to an element or feature in the singular does not exclude the possibility of a plurality of such elements or features, and that recitation of different features or elements in the appended claims does not necessarily imply separate components; a single component or unit may fulfil the function of several elements recited in a claim. Any reference signs in the appended claims shall not be construed so as to limit their scope.

The invention claimed is:

1. A transimpedance amplifier circuit comprising:
   a transimpedance amplifier configured to generate a first voltage based on a current at an input node for an input signal;
   a controlled voltage source for generating a second voltage based on a first control current; and
   a controller for collectively controlling the first control current and a second control current based on an indication of an input signal magnitude, wherein the second control current is subtracted from the current at the input node, wherein the controller is configured such that:
      for a first range of the input signal magnitude, a first magnitude of the first control current depends on the input signal magnitude and increases with increasing the input signal magnitude whilst a second magnitude of the second control current is substantially constant; and
      for a second, higher, range of the input signal magnitude, both the first magnitude of the first control current and the second magnitude of the second control current depend on the input signal magnitude and the second magnitude of the second control current increases with increasing the input signal magnitude while the first magnitude of the first control current reduces.

2. The transimpedance amplifier circuit of claim 1 wherein the controller controls a sum of the first magnitude of the first control current and the second magnitude of the second control current to be equal to a master control current that varies proportionally with the input signal magnitude.

3. The transimpedance amplifier circuit of claim 2 wherein the controller comprises a current steering circuit comprising a differential pair of transistors for steering current to a first circuit branch for the first control current or a second circuit branch for the second control current, wherein the current steering circuit is configured to increasing steer current to the second circuit branch for input signal magnitudes above a threshold, and wherein a total current through the first and second current branches is controlled based on the input signal magnitude.

4. The transimpedance amplifier circuit of claim 2 wherein the controller further comprises a current mirror for mirroring the master control current and outputting the mirrored current as an indication of received signal strength.

5. The transimpedance amplifier circuit of claim 1 wherein the controller is further configured to controllably vary a gain of the transimpedance amplifier with the input signal magnitude for at least one range of the input signal magnitude such that gain varies substantially continuously with the input signal magnitude.

6. The transimpedance amplifier circuit of claim 5 wherein the controlled voltage source comprises a dummy transimpedance amplifier and the controller is configured to control a gain of the dummy transimpedance amplifier in accordance with the gain of the transimpedance amplifier.

7. The transimpedance amplifier circuit of claim 5 wherein the controller is configured to vary the gain of the transimpedance amplifier by controllably varying a feedback resistance of a feedback resistance network connected across the transimpedance amplifier.

8. The transimpedance amplifier circuit of claim 7 wherein the feedback resistance network comprises at least a first transistor in parallel with a first resistance and the controller is configured to control a resistance of the first transistor so as to control the feedback resistance.

9. The transimpedance amplifier circuit of claim 8 wherein the feedback resistance network comprises a second resistance in series with the first resistance and a second transistor connected in parallel with the series connection of the first and second resistances, and the controller is further configured to control a resistance of the second transistor so as to control the feedback resistance.

10. The transimpedance amplifier circuit of claim 9 operable in at least a first mode for supporting a first data rate and a second mode for supporting a second, different, data rate, wherein the controller is configured to controllably vary the first resistance of the first transistor with the input signal magnitude in the first mode and to controllably vary the second resistance of the second transistor for higher input signal magnitudes in both the first and second modes.

11. The transimpedance amplifier circuit of claim 7 wherein the transimpedance amplifier comprises a compensation network configured to controllably vary an open-loop gain of the transimpedance amplifier to compensate for any changes in the feedback resistance.

12. The transimpedance amplifier circuit of claim 11 wherein the compensation network comprises at least one compensation circuit branch between a compensation node of the transimpedance amplifier and a reference voltage, wherein the at least one compensation circuit branch comprises a transistor for controlling a connection of a series capacitance and resistance of the at least one compensation circuit branch to the compensation node.

13. The transimpedance amplifier circuit of claim 1 comprising an integrator configured to receive a first integrator input based on the first voltage and a second integrator input based on the second voltage and to generate a corresponding integrated value as said indication of the input signal magnitude.

14. The transimpedance amplifier circuit of claim 13 comprising a summing node for summing the first and second voltages with DC offset signals from a DC offset controller to provide the first and second integrator inputs.

15. The transimpedance amplifier circuit of claim 13 wherein the integrator is operable with a plurality of different time constants to support different data rate modes.

16. The transimpedance amplifier circuit of claim 13 further comprising a reset controller configured to reset the integrator in response to a received reset trigger.

17. An optical receiver comprising the transimpedance amplifier circuit of claim 1, wherein the optical receiver is operable to receive burst mode optical data.

18. A transimpedance amplifier apparatus comprising:
an input transimpedance amplifier for generating a first voltage based on a current at an input current node;
a dummy transimpedance amplifier for generating a second voltage based on a first control current; and
a control loop comprising:
an integrator for generating an integrated value based on the first and second voltages; and
a controller configured to control the first control current, a DC restore current subtracted from the input current node and a gain of the input transimpedance amplifier based on the integrated value, wherein the controller is configured such that:
for a first range of an input signal magnitude, a first magnitude of the first control current depends on the input signal magnitude and increases with increasing the input signal magnitude whilst a second magnitude of the DC restore current is substantially constant; and
for a second, higher, range of the input signal magnitude, both the first magnitude of the first control current and the second magnitude of the DC restore current depend on the input signal magnitude and the second magnitude of the DC restore current increases with increasing the input signal magnitude while the first magnitude of the first control current reduces.

19. The transimpedance amplifier apparatus as claimed in claim 18, wherein the control loop is configured to generate a master current based on the integrated value and wherein an indication of received signal strength is output based on a master control current.

20. A transimpedance amplifier apparatus comprising:
an input transimpedance amplifier for generating a first voltage based on a current at an input current node;
a dummy transimpedance amplifier for generating a second voltage; and
a control loop configured to control a first control current for the dummy transimpedance amplifier, a DC restore current applied to the input current node and a gain of the input transimpedance amplifier, such that each of the first control current, the DC restore current and the gain vary continuously with an input signal magnitude over at least part of an input dynamic range of the transimpedance amplifier apparatus, wherein the control loop is configured such that:
for a first range of the input signal magnitude, a first magnitude of the first control current depends on the input signal magnitude and increases with increasing the input signal magnitude whilst a second magnitude of the DC restore current is substantially constant; and
for a second, higher, range of the input signal magnitude, both the first magnitude of the first control current and the second magnitude of the DC restore current depend on the input signal magnitude and the second magnitude of the DC restore current increases with increasing the input signal magnitude while the first magnitude of the first control current reduces.

\* \* \* \* \*